Figure 1:
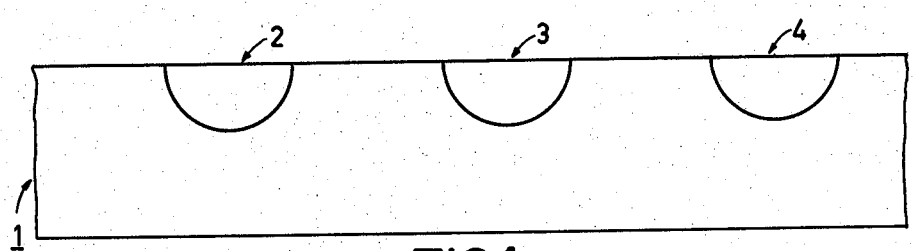

United States Patent [19]

Franken et al.

[11] 4,296,143
[45] Oct. 20, 1981

[54] METHOD OF PRODUCING MICROLENSES

[75] Inventors: Adrianus J. J. Franken; Giok D. Khoe, both of Eindhoven, Netherlands; Dieter Küppers, Aachen, Fed. Rep. of Germany

[73] Assignee: U.S. Philips Corporation, New York, N.Y.

[21] Appl. No.: 82,394

[22] Filed: Oct. 5, 1979

[30] Foreign Application Priority Data

Apr. 6, 1979 [DE] Fed. Rep. of Germany ....... 2913843

[51] Int. Cl.³ .......................... G02B 1/10; G02B 3/00; C03C 17/02
[52] U.S. Cl. ..................... 427/38; 350/167; 350/417; 350/96.15; 427/166; 427/167; 428/428
[58] Field of Search .......... 427/38, 166, 167

[56] References Cited

U.S. PATENT DOCUMENTS 3,666,347  5/1972  Kitano et al. .............. 65/3 A X

*Primary Examiner*—James R. Hoffman
*Attorney, Agent, or Firm*—Thomas A. Briody; Robert T. Mayer; Paul R. Miller

[57] ABSTRACT

Microlenses which are easy to handle are produced by providing rotation-symmetrical recesses in a glass plate, depositing vitreous layers by means of a vapor deposition process onto the plate, until the recesses are fully filled up, whereafter the thickness of the coated glass plate is reduced to the original value or to a smaller value. Two lenses produced in this manner are then combined to one lens by placing the embedded lenses on top of one another by means of their flat sides.

6 Claims, 7 Drawing Figures

METHOD OF PRODUCING MICROLENSES

The invention relates to a method of producing microlenses embedded in a glass plate. Microlenses are understood to mean lenses having a diameter smaller than 1 mm, particularly lenses having a diameter between 20 and 100 μm. Lenses of these dimensions are used in, for example, coupling elements for coupling optical wave guides to a light source or for coupling optical wave guides to one another. The lenses may consist of a material having a constant refractive index or, alternatively, have a refractive index profile.

Methods of producing spherical lenses which can be used for the above-mentioned purposes are known.

U.S. Pat. No. 3,666,347 describes a method wherein first homogeneous glass spheres of the desired diameter and having a high refractive index are produced. The spheres have a high thallium oxide content. The spheres are immersed in a molten molten salt bath which has been heated to a high temperature and which contains potassium ions. The thallium ions and the potassium ions are exchanged by means of diffusion. This produces a refractive index profile across the diameter of the sphere.

The method results in a profile which is obtained by means of diffusion and which will, generally, be an approximation of a desired profile.

German Pat. No. 2,723,972 describes in addition to further ion exchange methods also a method of producing spherical lenses in which glass nuclei of a very small diameter are coated from the vapour phase with layers of mixtures of oxides, whose refractive index decreases versus the diameter. Such layers of a mixture of titanium dioxide and silicon dioxide can be obtained from an atmosphere containing oxygen, titanium tetrachloride and silicon tetrachloride, the $TiCl_4$ ratio being continuously reduced during the coating operation.

In practice it is hardly possible to prevent the spheres from colliding during coating when several spheres are coated simultaneously; this results in cloudly layers and a decrease in the transparency of the lenses.

The known methods furnish a number of separate glass spheres. For use in coupling elements of the type mentioned in the opening paragraph, spheres are required which have a diameter in the order of the diameter of the optical fiber core. Such spheres having a diameter smaller than 100 μm can only be handled in a complicated manner and special tools are required in utilizing them for the above-mentioned purpose.

It is an object of the invention to provide a method of producing microlenses which can be handled in a simple manner.

According to the invention this object is accomplished in that rotation-symmetrical recesses are provided in a glass plate, whereafter vitreous layers are deposited on the plate by means of a vapour deposition process, until the recesses are completely filled up, whereafter the thickness of the coated glass plate is reduced to the original value or to a smaller value.

With the method according to the invention it is also possible to produce microlenses having a refractive index profile of a desired shape. To that end vitreous layers having a progressively increased refractive index are vapour deposited on the glass plate, these layers consist, for example, of doped quartz glass. In this manner the desired refractive index profile, for example a parabolic profile, can be obtained. The glass plate may, for example, consist of quartz glass or of glass.

The rotation-symmetrical recesses can be produced in the glass plate in different ways.

The recesses can, for example, be drilled or etched in the glass plate. When they are produced by means of etching a photoresist mask is first provided on the plate, etching being done in the next step. Etching can be done either by means of the known wet chemical methods or by means of plasma etching. Care should be taken that etching takes place isotropically. The photoresist is removed in the subsequent step. A further possibility is to produce the recesses by burning in by strong local heating and evaporation of the material by means of a laser. It is further possible to press the recesses at an elevated temperature in the softened glass using a mould.

To produce microlenses having a parabolic refractive index profile, advantageous use is made of a glass plate having semi-spherical recesses.

In the subsequent step of the process according to the invention vitreous layers are deposited from the vapour phase onto the glass plate. This deposition can be effected by means of a chemical vapour deposition process. The composition of the vapour phase is not changed when the production of lenses having a constant refractive index is involved. A suitable material is, for example, $Si_3N_4$. In the production of lenses having a refractive index profile, quartz glass layers having a continuously increased quantity of doping material are deposited on top of each other, until the desired refractive index is reached in the last layer. The value of the refractive index difference to be reached may be a limiting factor in choosing the possible doping materials. We have found that, for example, $Si_3N_4$, $Sb_2O_3$ and other materials which can be used as a quartz doping material and which have a refractive index in the order of 2 are suitable for the production of spherical lenses.

An ideal spherical lens (Luneberg lens) requires an accurately parabolic refractive index profile of the form $n=[2-(r/a)^2]^{\frac{1}{2}}$. This lens has a refractive index $N=\sqrt{2}$ in the centre at $r=0$ and a refractive index of $n=1$ at $r=a$, wherein a is the radius of the sphere. Since there is no glass having a refractive index $n=1$, the aim was a lens with $n=n_o[2-(r/a)^2]^{\frac{1}{2}}$, where $n_o=1.45$ is the refractive index of quartz glass. In that case $n=2.05$ in the centre of the sphere and $n=1.45$ at the edge.

In the method according to the invention the layer is preferably deposited by means of the so-called non-isothermal plasma-CVD method from the gas phase. A "non-isothermal plasma-CVD method" is here understood to mean a method in which a so-called cold plasma is used, and in which only electrons have a high kinetic energy. With such a plasma it is even possible to bring gas mixtures to reaction which are thermally not reactive. Furthermore, we have found that vitreous layers can be deposited by means of the non-isothermal PCVD-method directly from the gas phase at a rather low temperature, so that a subsequent heating operation for the purpose of vitrifying, which is necessary in a method in which a glass soot layer is deposited, can be omitted. The use of this method has the additional advantage that when deposition is done at a relatively low temperature, that is to say at temperatures between room temperature and 300° C., any difference in the coefficients of thermal expansion of the material of the glass plate and of the deposited layers does not become apparent in a detrimental manner.

Reducing the thickness of the coated glass plate to the original or to a smaller value is effected by, for example, grinding and/or polishing.

Two lenses thus produced are then combined to one lens, by laying the embedded lenses on top of one another by means of their flat sides.

Figure 2:
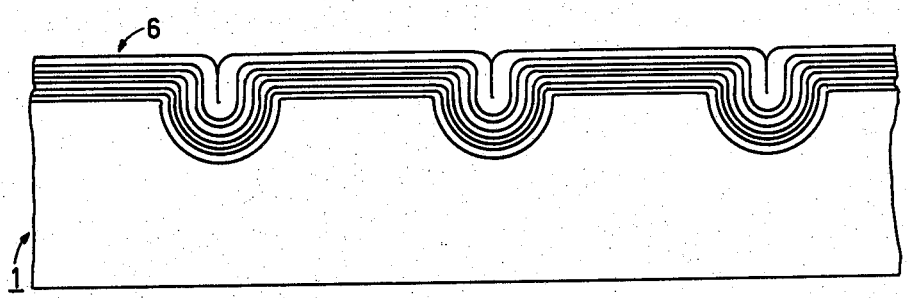
Figure 3:
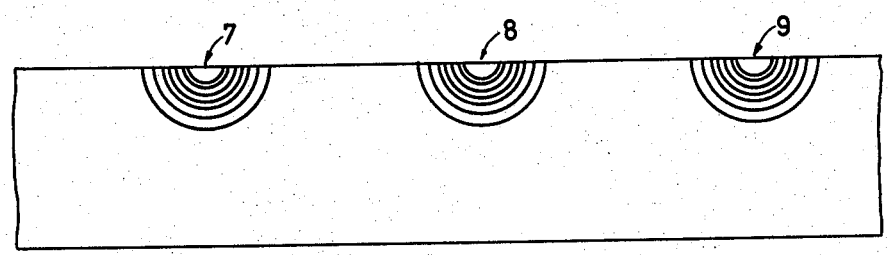
Figures 4A, 4B:
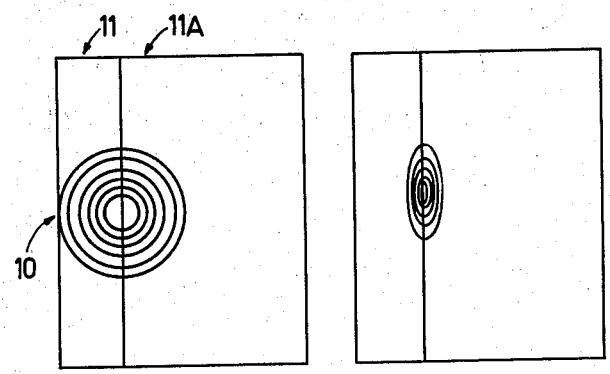

The invention will now be further explained with reference to a drawing and some embodiments. In the drawing FIG. 1 is a cross-sectional view of a portion of a quartz glass plate having semi-spherical recesses, FIG. 2 is a cross-sectional view of a coated plate, FIG. 3 is a cross-sectional view of a plate shown in FIG. 2 after final-polishing, FIG. 4a is a cross-sectional view of a finished spherical lens, FIG. 4b is a cross-sectional view of a finished flat lens, FIG. 5 is a schematical view of a coating apparatus and FIG. 6 is a schematical view of a coupling element.

EXAMPLE 1

By means of a $CO_2$ laser semi-spherical recesses 2, 3 and 4 having a diameter of 70 μm are produced in a quartz glass plate 1 (30 mm, 30 mm, 1 mm thick). (FIG. 1).

Figure 5:
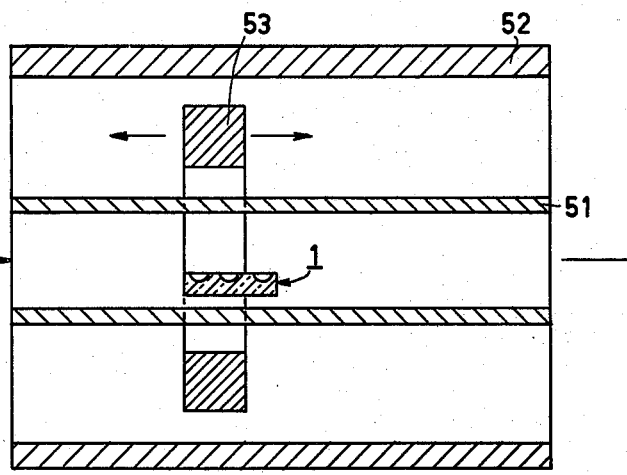
Figure 6:
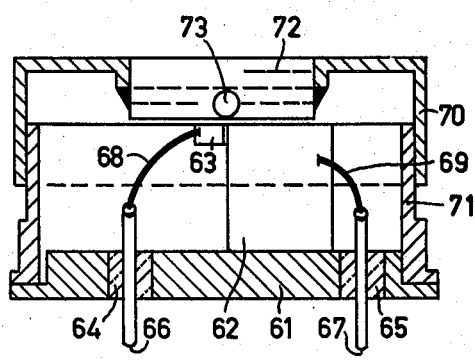

Then the plate 1 containing the semi-spherical holes are placed in a reaction tube 51 (FIG. 5). The reaction tube 51 is located in an electric furnace 52 in which a microwave resonator 53 can be moved reciprocatingly along the reaction tube. A layer 6 of $Si_3N_4$, which is 55 μm thick, is now deposited from the gas phase by means of a non-isothermal plasma. During the deposition the plate 1 has a temperature of some hundreds of degees centrigrade. The pressure in the reaction tube 51 was approximately 6 mbar. A gas mixture consisting of $SiCl_4$ and $NH_3$ was used. The quantities of the reacting gasses were measured in cubic cm per minute at 0° C., 1000 mbar (=sccm: standard cubic centimeter per minute). These quantities were 10 sccm for $SiCl_4$ and 0 to 30 sccm for $NO_2$. The plasma was produced by means of the microwave resonator 53 at a frequency of 2.45 GHz. The coating 6 consisted of 1000 individual layers, so that each layer was 0.035 μm thick (FIG. 2), the Figure showing only a few layers.

Thereafter the thickness of the quartz glass plate 1 is reduced by means of polishing to the original value, which results in semi-spherical lenses (7, 8, 9) of a constant refractive index, which are integrated in the quartz glass (FIG. 3). Two quartz glass plates are fastened to one another so that one or more spherical lenses 10, embedded in quartz glass 11—11a are obtained (FIG. 4a). On one side the distance between the lens 10 and the surface of the quartz glass disc 11 can then be made such by means of a polishing operation that it corresponds to the focal length of the lens 10. The surface of the disc 11 is then an excellent reference for the orientation of the light source. If the quartz plate is polished to below the original value, flat lenses are obtained whose focal lengths are variable in dependence on the radius of curvature of the holes and the refractive index of the lens material (FIG. 4b).

EXAMPLE 2

In a further experiment a lens was produced having a graded refractive index variation, a so-called Luneberg lens. The semi-spherical recesses were produced in the same manner as described for Example 1. The experimental setup for the coating operation, the pressure, temperature etc. also corresponded to the setup of the first example, the difference being in the type of gas used and in the flow rate of these gases. $SiH_4$, $NH_3$ and $N_2O$ were used, the gas streams having the following values:

$SiH_4$: 10 sccm, constant for the duration of the experiment, $NH_3$: 0 to 30 sccm, increasing during the duration of the experiment, $N_2O$: 50 to 0 sccm, decreasing during the duration of the experiment.

The ratio between N and O in the gas phase at a constant $SiH_4$ gas stream determines the $SiO_2$—$Si_3N_4$ ratio in the deposited layer and, consequently, the refractive index. A parabolic refractive index profile was obtained. The thickness of the layers and the subsequent grinding steps were the same as in the first embodiment.

The invention relates further to a coupling element having a light source and a lens, the light source being fixed to a support, which is provided with a cap which contains the lens. A microlens having very small dimensions and embedded in the glass plate according to the invention can be arranged in the cap relative to the light source in the most simple manner. FIG. 6 is a schematical representation of an embodiment of a coupling element according to the invention. A copper block 62 which functions as a heat sink is present on a metallic supporting member 61. A laser diode 63 is mounted on the block 62. Furthermore, the support 61 comprises two glass feedthroughs 64 and 65, in which connecting pins 66 and 67 are arranged, which are connected to the laser diode 63 and to the copper block 62 via leads 68 and 69, respectively. In addition, the element comprises a cap 70 and a container 71. The glass plate 72 is fastened in the cap 70, for example by means of a glue. The glass plate 72 contains the spherical lens 73. The lens 73 is aligned so, that the centre of the lens coincides with the main axis of the light beam emerging from the laser diode 63.

The method according to the invention has the following advantages:

(1) The lens is automatically integrated in a glass window which can be handled in a simple manner and, for actual use, can be placed in a hermetically closed coupling element, (2) A vary accurate reflective index profile of substantially any desired shape can be produced by means of a CVD-procedure, particularly a non-isothermal plasma CVD deposition procedure.

(3) A large number of recesses and, consequently, microlenses can be produced on one single glass plate.

(4) Rotation-symmetrical lenses of any desired shape and refractive index profile can be produced by means of the method according to the invention.

What is claimed is:

1. A method of producing microlenses embedded in a glass plate, characterized in that rotation-symmetrical recesses are produced in a glass plate, whereafter vitreous layers are deposited on the plate by means of a vapour deposition process until the recesses are fully filled up, whereafter the thickness of the coated glass plate is reduced to the original value or to a lower value.

2. A method as claimed in claim 1, characterized in that the vitreous layers are deposited with an increasing refractive index.

3. A method as claimed in claim 2, characterized in that layers of quartz glass having an increasing content of silicon nitride are deposited.

4. A method as claimed in claim 1, characterized in that semi-spherical recesses are provided in the glass plate.

5. A method as claimed in claim 1, characterized in that the vitreous layers are deposited by means of a non-isothermal plasma CVD method from the gas phase.

6. A method according to claim 1, characterized in that two lenses are produced and are combined into one lens structure by placing the two lenses on top of one another at flat sides.

* * * * *